United States Patent
Truong et al.

(10) Patent No.: US 8,098,083 B2
(45) Date of Patent: Jan. 17, 2012

(54) APPARATUS AND METHOD FOR CONTROLLING DELAY STAGE OF OFF-CHIP DRIVER

(75) Inventors: Phat Truong, Houston, TX (US); Mosaddiq Saifuddin, Houston, TX (US); Chia-Jen Chang, Sugar Land, TX (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 173 days.

(21) Appl. No.: 12/416,929

(22) Filed: Apr. 2, 2009

(65) Prior Publication Data
US 2010/0253391 A1 Oct. 7, 2010

(51) Int. Cl.
*H03K 19/0175* (2006.01)
*H03B 1/00* (2006.01)

(52) U.S. Cl. ........... 326/82; 327/108; 327/109; 326/86

(58) Field of Classification Search .......... 326/30, 326/80–87
See application file for complete search history.

(56) References Cited

U.S. PATENT DOCUMENTS

| | | | | |
|---|---|---|---|---|
| 6,566,903 B1* | 5/2003 | Mandal et al. | ............ | 326/30 |
| 6,624,655 B2* | 9/2003 | Mandal et al. | ............ | 326/30 |
| 6,972,607 B1* | 12/2005 | Chen et al. | ............ | 327/291 |
| 7,400,212 B1* | 7/2008 | Vishinsky | ............ | 333/17.1 |
| 7,650,526 B2* | 1/2010 | Alon et al. | ............ | 713/503 |
| 2008/0122478 A1* | 5/2008 | Mei | ............ | 326/27 |
| 2009/0267698 A1* | 10/2009 | Lin | ............ | 331/57 |

* cited by examiner

*Primary Examiner* — Shawki S Ismail
*Assistant Examiner* — Thienvu Tran
(74) *Attorney, Agent, or Firm* — Winston Hsu; Scott Margo

(57) ABSTRACT

A multiple-finger off-chip driver (OCD) uses delay between branches of the output stage. The delay between branches is controlled using bias circuitry which compensates for process, temperature, and voltage (PVT) variations, resulting in less variation of slew rate at the output of the OCD. The OCD includes a time domain delay stage; a pre-driver stage; a final driver stage; and a bias circuit, for providing bias voltages to the time domain stage that compensate for process, temperature and voltage (PVT) variations on the time domain stage.

3 Claims, 3 Drawing Sheets

APPARATUS AND METHOD FOR CONTROLLING DELAY STAGE OF OFF-CHIP DRIVER

BACKGROUND OF THE INVENTION

1. Field of the Invention

The present invention relates to off-chip drivers, and more particularly, to off-chip drivers including a delay stage, and methods for controlling the delay stage to control the slew rate.

2. Description of the Prior Art

An off-chip driver is a well-known circuit in the field of electrical technology. One key characteristic of an OCD is the slew rate of the output. Conventional OCD employ different methods to control the slew rate. Among these methods is one that includes delay stages for more accurately controlling slew rate.

In an example circuit, the pre-driver is divided into two branches, as is the final driver. The time domain stage (delay stage) includes two sets of delay elements, comprising transistor elements for providing a voltage signal in response to a data in (logic) signal, and buffers, for buffering the voltage signals, wherein the output of the delay stage is input to the pre-drivers. A first voltage signal is buffered in a first buffer, and is utilized to turn on the first branch of the pre-driver, which controls the first branch of the final driver; a second voltage signal is buffered in a second buffer, and is utilized to turn on the second branch of the pre-driver, which controls the second branch of the final driver.

The delay elements help to provide a more gradual controlled response at the output. Although the utilization of delay elements helps to more accurately control the slew rate of an OCD, the buffers are susceptible to process, voltage and temperature (PVT) variations. If there is some variation in the external conditions, the delay between these branches changes, and therefore the slew rate will be affected. In the current scheme these variations push each stage in the same direction, whereby the effect is amplified. In the example circuit mentioned, if the supply voltage was lowered the output stage would operate slower. Additionally, with a low supply voltage the delay between the branches would also be larger. Both of these effects go on to reduce the slew rate.

SUMMARY OF THE INVENTION

It is an objective of the present invention to provide an apparatus and method that can compensate for the process, voltage and temperature variations in the slew rate of an OCD.

In one preferred embodiment, a method for compensating for PVT variations in an off-chip driver (OCD) circuit comprises: providing bias voltages that compensate for process, temperature and voltage (PVT) variations; generating a first and second delayed voltage signal in response to a logic signal and the bias voltages, where the delay between these voltage signals is varied in accordance with the bias voltages; receiving the first delayed voltage signal and the second delayed voltage signal and generating a first driving voltage and a second driving voltage according to the first delayed voltage signal and the second delayed voltage signal, respectively; and utilizing the first and the second driving voltage to generate a final output voltage with a controlled slew rate.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

The present invention utilizes bias voltages that are supplied to at least one delay element of a time domain delay stage of an OCD. These bias voltages act as compensating voltages that can counteract the effects of temperature, voltage and process variations.

Figure 1:
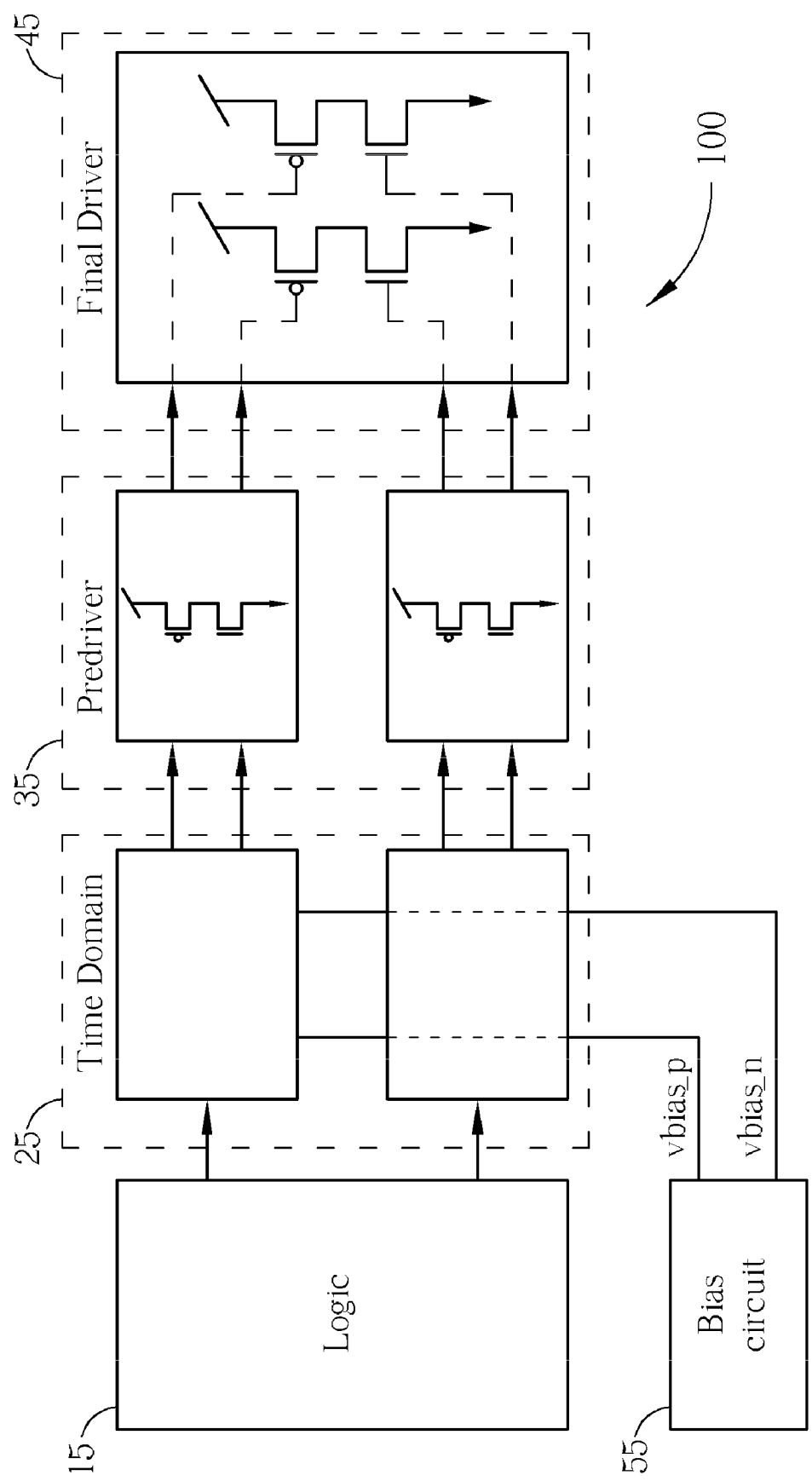
FIG. 1 is a diagram of an OCD according to an exemplary embodiment of the present invention.

Referring to FIG. 1, an OCD 100 is depicted comprising a time domain stage 25, a pre-driver 35 and a final driver 45. A bias circuit 55 is coupled to the time domain stage 25, for providing at least a p-channel and at least an n-channel bias voltage. These input bias voltages are controlled to compensate temperature, voltage and process variations.

Figure 2:
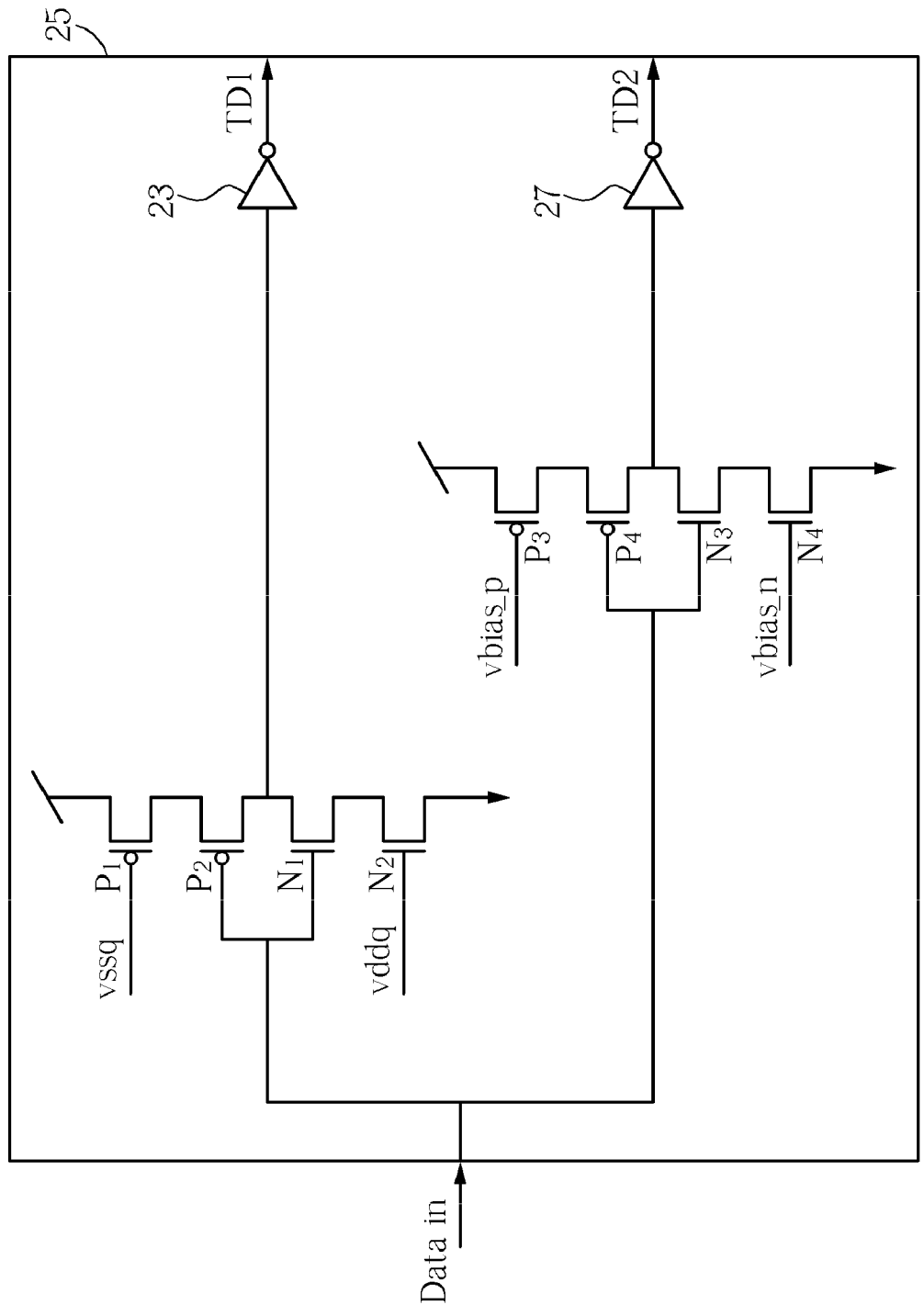
FIG. 2 is a diagram of a time domain stage of the OCD shown in FIG. 1.

FIG. 2 is a diagram of the time domain stage 25. As shown, the time domain stage 25 comprises first delay elements including transistors P1, P2, N1, N2, and a first inverter 23, and second delay elements including transistors P3, P4, N3, N4 and a second inverter 27. Each delay element is composed of two PMOS devices in series, along with two NMOS devices in series. The inner NMOS-PMOS pair (N1-P2 for first delay element) share a gate connection to Data in, and operate like an inverter. The outer NMOS-PMOS pair (N2-P1 for first delay element) function like valves controlling the current provided to the inner pair. In this example the outer transistors for the first delay element are tied to the power rails to provide a higher current than is provided to the second delay element. The current for the second delay element is controlled by bias signals which compensate for variations in process, supply voltage and temperature.

Figure 3:
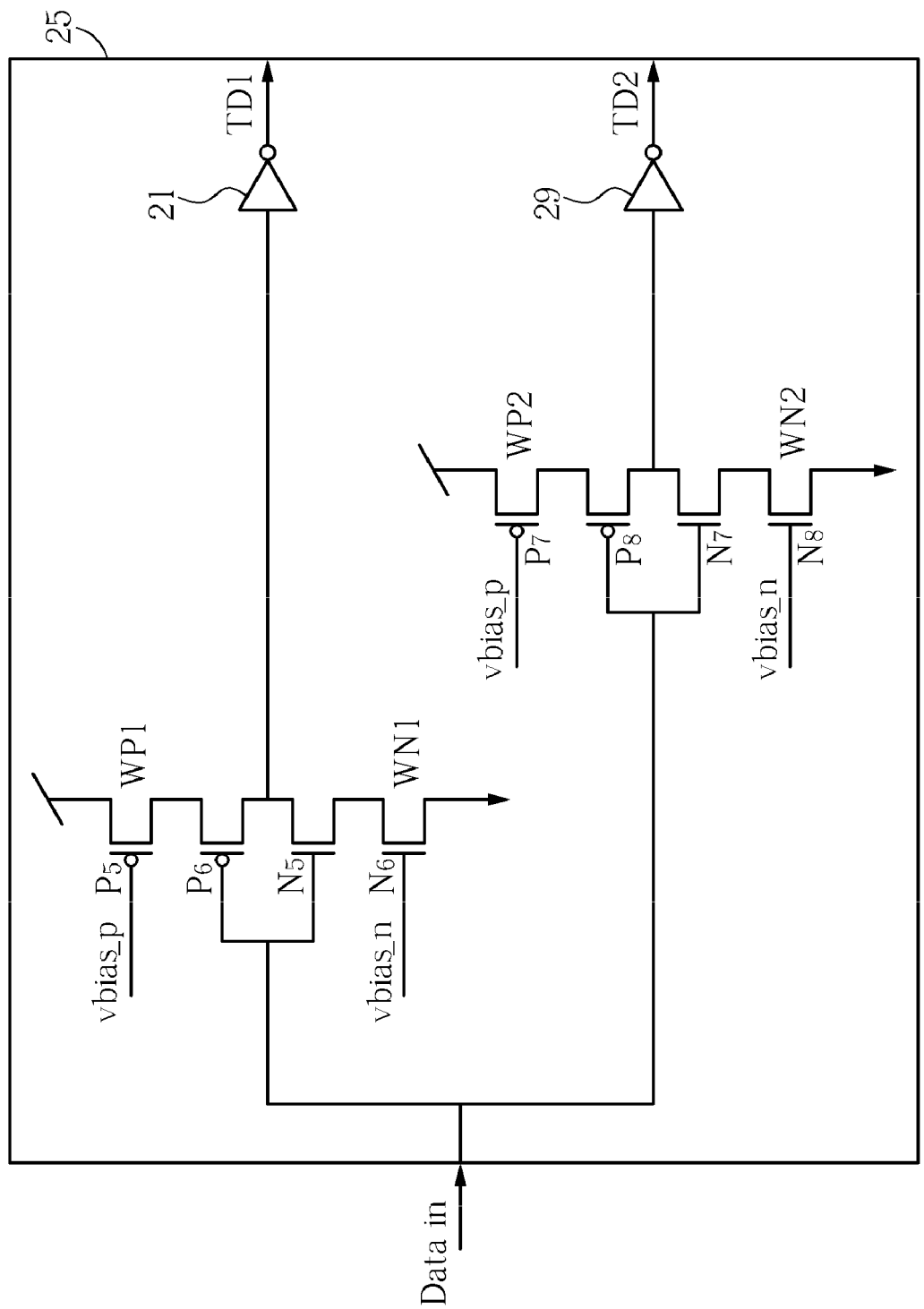
FIG. 3 is an alternate implementation of a time domain stage of the OCD shown in FIG. 1.

FIG. 3 is a diagram of an alternate implementation of the time domain stage 25. As shown, the time domain stage 25 comprises first delay elements including transistors P5, P6, N5, N6, and a first inverter 21, and second delay elements including transistors P7, P8, N7, N8 and a second inverter 29. Each delay element is composed of two PMOS devices in series, along with two NMOS devices in series. The inner NMOS-PMOS pair (N5-P6 for first delay element) share a gate connection to Data in, and operate like an inverter. The outer NMOS-PMOS pair (N6-P5 for first delay element) function like valves controlling the current provided to the inner pair. In this example the width of transistors P5, N6, P7, and N8 are varied to set the delay between TD1 and TD2. The ratio between WP1 and WP2 is altered to change the difference in delay. WN1 and WN2 should be sized to the same ratio. The vbias_n and vbias_p operate similar to FIG. 2 and compensate for PVT variations.

Given the output TD1 arrives at $T_1$ and the output TD2 arrives at $T_2$, the delay between the two outputs can be defined as $T_{Delta}=T_2-T_1$. When the PVT variations are such that $T_1$ is earlier in time than the nominal case, the bias signals ensure that $T_2$ arrives later in time than the nominal case. That is, $T_{Delta}$ will be larger when PVT variations speed up propagation time across stages. Similarly, the bias signal should ensure that the signals pull closer together (smaller $T_{Delta}$) when the PVT variations slow the propagation time across stages.

Referring to FIG. 1, TD1 and TD2 drive two different branches of the output stage. The output stage operates in accordance with the same PVT variations as the Time Domain stage. Variations in PVT at the output stage are compensated by adjusting $T_{Delta}$. As previously described, for a faster PVT variation, $T_{Delta}$ is increased, which slows the output stage slew rate to counteract the PVT variations. Similarly for slower PVT variations $T_{Delta}$ is decreased, which counters the effects of PVT variations on the output stage slew rate.

It should be noted that the representation of first and second delay elements in FIG. 2 and FIG. 3 are merely embodiments of the present invention. A time domain delay stage comprising two or more delay elements that utilizes the concept of bias voltages to compensate for PVT variations also falls within the scope of the present invention.

In summary, the present invention provides bias voltages that compensate PVT variations to at least one delay stage of a time domain delay stage, thereby reducing slew rate of the final output driver slew rate.

Those skilled in the art will readily observe that numerous modifications and alterations of the device and method may be made while retaining the teachings of the invention.

What is claimed is:

1. An off-chip driver (OCD), comprising:
   a time domain stage, coupled to a logic input, comprising:
      a plurality of buffers, for generating at least a first delayed voltage signal and a second delayed voltage signal in response to a logic signal; and
      a mechanism to provide at least a first delayed voltage and a second delayed voltage, whereby a delay between the first and second delayed voltages reverse tracks process, voltage, and temperature (PVT) variations;
   a pre-driver stage, coupled to the time domain stage, for receiving at least the first delayed voltage signal and the second delayed voltage signal and generating at least a first driving voltage and a second driving voltage according to the first delayed voltage signal and the second delayed voltage signal, respectively;
   a final driver stage, coupled to the pre-driver stage, for utilizing the first driving voltage and the second driving voltage to generate a slew rate controlled final output voltage; and
   a bias circuit, coupled to the time domain stage, for providing bias voltages to the second delayed voltage signal that compensate for the PVT variations on the time domain stage.

2. The OCD of claim 1, wherein the pre-driver stage is divided into a first branch and a second branch, the first branch receives the first delayed voltage signal to generate the first driving voltage and the second branch receives the second delayed voltage signal to generate the second driving voltage.

3. A method for controlling slew rate of an off-chip driver by compensating for process, voltage, and temperature (PVT) variations in a delay stage comprising:
   generating a first delayed voltage signal in response to a logic signal;
   providing bias voltages that compensate for the effects of the PVT variations;
   generating a second delayed voltage signal in response to the logic signal and the bias voltages;
   utilizing a mechanism to provide at least a first delayed voltage and a second delayed voltage, whereby a delay between the first and second delayed voltages reverse tracks the PVT variations;
   receiving the first delayed voltage signal and the second delayed voltage signal and generating a first driving voltage and a second driving voltage according to the first delayed voltage signal and the second delayed voltage signal, respectively; and
   utilizing the first driving voltage and the second driving voltage to generate a slew rate controlled final output voltage.

* * * * *